United States Patent
Son et al.

(10) Patent No.: US 7,071,048 B2
(45) Date of Patent: Jul. 4, 2006

(54) METHODS OF FABRICATING FIN FIELD EFFECT TRANSISTORS HAVING CAPPING INSULATION LAYERS

(75) Inventors: Yong-Hoon Son, Gyeonggi-do (KR); Si-Young Choi, Gyeonggi-do (KR); Byeong-Chan Lee, Gyeonggi-do (KR); Deok-Hyung Lee, Gyeonggi-do (KR); In-Soo Jung, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/936,033

(22) Filed: Sep. 8, 2004

(65) Prior Publication Data
US 2005/0093082 A1 May 5, 2005

(30) Foreign Application Priority Data
Oct. 31, 2003 (KR) .................. 10-2003-0076960

(51) Int. Cl.
*H01L 21/8238* (2006.01)

(52) U.S. Cl. .................. 438/206; 438/212; 438/268; 438/279

(58) Field of Classification Search ........... 438/197, 438/206, 212, 268, 279
See application file for complete search history.

(56) References Cited

U.S. PATENT DOCUMENTS

| | | | |
|---|---|---|---|
| 6,432,829 B1 | 8/2002 | Muller et al. | 438/694 |
| 6,800,905 B1* | 10/2004 | Fried et al. | 257/351 |
| 2004/0235300 A1* | 11/2004 | Mathew et al. | 438/689 |
| 2004/0262692 A1* | 12/2004 | Hareland et al. | 257/369 |

FOREIGN PATENT DOCUMENTS

KR   10-2003-0020644   3/2003

* cited by examiner

*Primary Examiner*—Hsien-Ming Lee
(74) *Attorney, Agent, or Firm*—Myers Bigel Sibley & Sajovec, PA (57) ABSTRACT

A field effect transistor includes a vertical fin-shaped semiconductor active region having an upper surface and a pair of opposing sidewalls on a substrate, and an insulated gate electrode on the upper surface and opposing sidewalls of the fin-shaped active region. The insulated gate electrode includes a capping gate insulation layer having a thickness sufficient to preclude formation of an inversion-layer channel along the upper surface of the fin-shaped active region when the transistor is disposed in a forward on-state mode of operation. Related fabrication methods are also discussed.

20 Claims, 9 Drawing Sheets

Fig. 1

(PRIOR ART)

Fig. 2

(PRIOR ART)

METHODS OF FABRICATING FIN FIELD EFFECT TRANSISTORS HAVING CAPPING INSULATION LAYERS

CLAIM OF PRIORITY

This application claims priority from Korean Patent Application No. 10-2003-76960, filed on Oct. 31, 2003, the disclosure of which is hereby incorporated herein by reference.

FIELD OF THE INVENTION

The present invention relates to semiconductor devices, and more specifically, to field effect transistors and methods of forming the same.

BACKGROUND OF THE INVENTION

As semiconductor devices become highly integrated, transistor size may be reduced, which may result in a variety of operational and structural problems. For instance, short channel effects may be increased, and punch-through characteristics between source and drain regions may deteriorate. In addition, the turn-on current of the transistor may be decreased, and transistor performance may be degraded.

To address some of these problems, fin field effect transistors (Fin-FETs) have been developed. A fin field effect transistor can include a gate electrode on an upper surface and sidewalls of a silicon fin that vertically protrudes from a semiconductor substrate. Source and drain regions may also be formed in the silicon fin on opposite sides of the gate electrode. Thus, a channel region may be formed at both sidewalls and at the upper surface of the silicon fin, such that the channel width of the transistor may be increased. In addition, the gate electrode can control the channel region at both sides, thereby improving device controllability. Furthermore, turn-on current may be increased due to the greater channel width, thereby improving both performance as well as punch-through characteristics between the source and drain.

However, problems may occur at corner portions of the channel region, i.e. where a sidewall portion and a top surface portion of the channel region meet.

Figure 1:
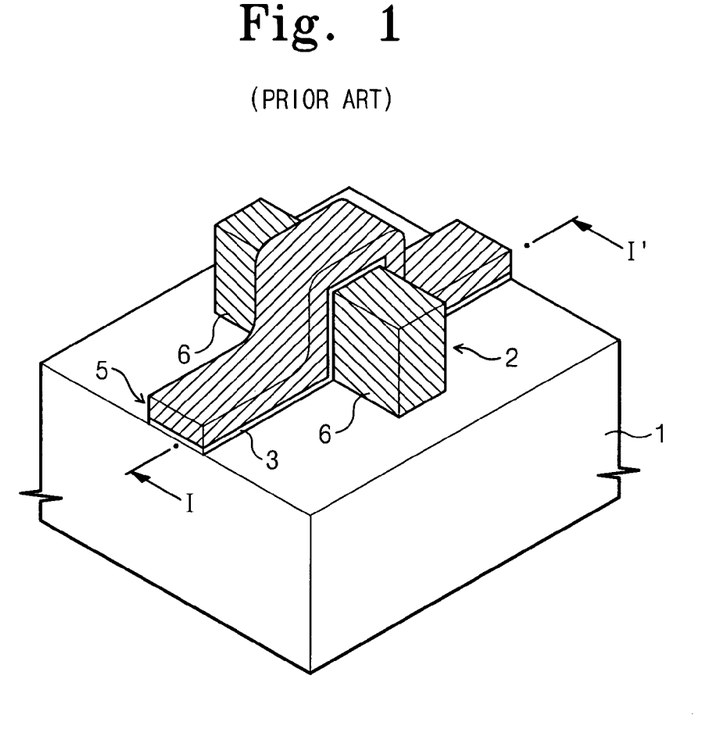
FIG. 1 is a perspective view illustrating a conventional fin field effect transistor.
Figure 2:
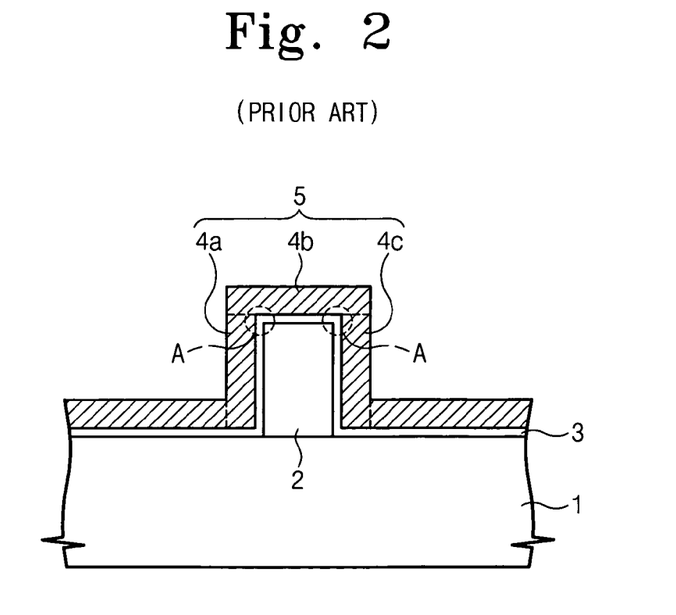
FIG. 2 is a cross-sectional view of a conventional fin field effect transistor, taken along line I–I' of FIG. 1.

FIG. 1 is a perspective view illustrating a conventional fin field effect transistor (Fin FET). FIG. 2 is a cross-sectional view of the Fin FET taken along line I–I' of FIG. 1.

Referring to FIGS. 1 and 2, a silicon fin 2 vertically protrudes from a semiconductor substrate 1. A gate electrode 5 crosses over the silicon fin 2. In other words, the gate electrode 5 passes over both sidewalls and the upper surface of the silicon fin 2. A gate oxide layer 3 is formed between the gate electrode 5 and the silicon fin 2. Source/drain regions 6 are formed in the silicon fin 2 on both sides of the gate electrode 5.

The gate electrode 5 may include three parts: a first gate 4a at one sidewall of the silicon fin 2, a second gate 4b at the upper surface of the silicon fin 2, and a third gate 4c at another sidewall of the silicon fin 2. Accordingly, the channel region may include vertical channel portions formed at both sidewalls of the silicon fin 2 and a top channel portion formed at the upper surface of the silicon fin 2.

However, when a voltage is applied to the gate electrode 5 of a fin field effect transistor having the above-mentioned structure, the electric field may be concentrated on corner portions "A" of the fin 2, i.e. where the vertical channel portions meet the top channel portions. This may result in a "hump" in the subthreshold current. In other words, leakage current may occur at voltages lower than threshold voltage of the fin field effect transistor. As a result, characteristics of the fin field effect transistor may be degraded.

SUMMARY OF THE INVENTION

According to some embodiments of the present invention, a field effect transistor may include a vertical fin-shaped semiconductor active region having an upper surface and a pair of opposing sidewalls on a substrate, and an insulated gate electrode on the upper surface and opposing sidewalls of the fin-shaped active region. The insulated gate electrode may include a capping gate insulation layer having a thickness sufficient to preclude formation of an inversion-layer channel along the upper surface of the fin-shaped active region when the transistor is disposed in a forward on-state mode of operation.

In other embodiments, the insulated gate electrode may further include a sidewall gate insulation layer on upper sidewalls of the fin-shaped active region. The thickness of the capping gate insulation layer may be greater than a thickness of the sidewall gate insulation layer. In further embodiments, the capping gate insulation layer and the sidewall gate insulation layer may be formed of oxide layers.

In some embodiments, the insulated gate electrode may further include a sidewall gate insulation layer on upper sidewalls of the fin-shaped active region having a thickness similar to the thickness of the capping gate insulation layer. The capping gate insulation layer may be formed of a material having a higher dielectric strength than the sidewall gate insulation layer.

In other embodiments, the field effect transistor may further include a buffer oxide layer on lower sidewalls of the fin-shaped active region, a liner layer on the buffer oxide layer and extending on sidewalls of the fin-shaped active region away from the substrate, and an insulation layer on the liner layer and separated from the fin-shaped active region by the liner layer. The transistor may also include a supplemental insulation layer on the substrate adjacent lower sidewalls of the fin-shaped active region.

In some embodiments, the field effect transistor may also include a planar active region adjacent the fin-shaped active region on the substrate.

According to other embodiments of the present invention, a method of forming a vertical channel field effect transistor on a fin-shaped active region of a semiconductor substrate may include forming an insulated gate electrode on an upper surface and opposing sidewalls of the fin-shaped active region. The step of forming the insulated gate electrode may include forming a capping gate insulation layer on the upper surface of the fin-shaped active region to a thickness sufficient to preclude formation of an inversion-layer channel along the upper surface when the transistor is disposed in a forward on-state mode of operation.

In some embodiments, the step of forming the insulated gate electrode may further include forming a sidewall gate insulation layer on sidewalls of the fin-shaped active region. The capping gate insulation layer may be formed to a thickness greater than a thickness of the sidewall gate insulation layer. In further embodiments, the step of forming the capping gate insulation layer may include thermally oxidizing the upper surface of the fin-shaped active region.

In other embodiments, the step of forming the insulated gate electrode may further include forming a sidewall gate insulation layer on sidewalls of the fin-shaped active region having a thickness similar to the thickness of the capping gate insulation layer. The capping gate insulation layer may be formed of a material having a higher dielectric strength than the sidewall gate insulation layer.

In some embodiments, forming a sidewall gate insulation layer may include forming a buffer oxide layer on the substrate, forming a liner layer on the buffer oxide layer, forming a insulation layer on the liner layer, and planarizing the insulation layer, the liner layer, and the buffer oxide layer to expose the upper surface of the fin-shaped active region. The method may further include recessing the liner layer to expose a portion the buffer oxide layer on upper sidewalls of the fin-shaped active region, removing the exposed portion of the buffer oxide layer to expose the upper sidewalls of the fin-shaped active region, and then forming a sidewall gate insulation layer on the exposed upper sidewalls of the fin-shaped active region. In addition, a supplemental insulation layer may be formed on the buffer oxide layer prior to forming the liner layer.

In other embodiments, the substrate may include a planar active region adjacent the fin-shaped active region. After the step of planarizing, the method may further include forming an oxidation barrier layer on the fin active region and the planar active region, and patterning the oxidation barrier layer to expose the top surface of the fin active region. The step of recessing the liner layer may include simultaneously recessing the liner layer on the fin-shaped active region and the oxidation barrier layer on the planar active region.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. It will be understood that when an element such as a layer, region or substrate is referred to as being "on" another element, it can be directly on the other element or intervening elements may also be present. It will be understood that when an element such as a layer, region or substrate is referred to as "under" another element, it can be directly under the other element or intervening elements may also be present. It will also be understood that the term "and/or" as used herein refers to and encompasses any and all possible combinations of one or more of the associated listed items.

Furthermore, relative terms such as beneath may be used herein to describe one layer or region's relationship to another layer or region as illustrated in the Figures. It will be understood that these terms are intended to encompass different orientations of the device in addition to the orientation depicted in the Figures. For example, if the device in the Figures is turned over, layers or regions described as "beneath" other layers or regions would now be oriented "above" these other layers or regions. The term "beneath" is intended to encompass both above and beneath in this situation. Like numbers refer to like elements throughout.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. All publications, patent applications, patents, and other references mentioned herein are incorporated by reference in their entirety.

Figure 3:
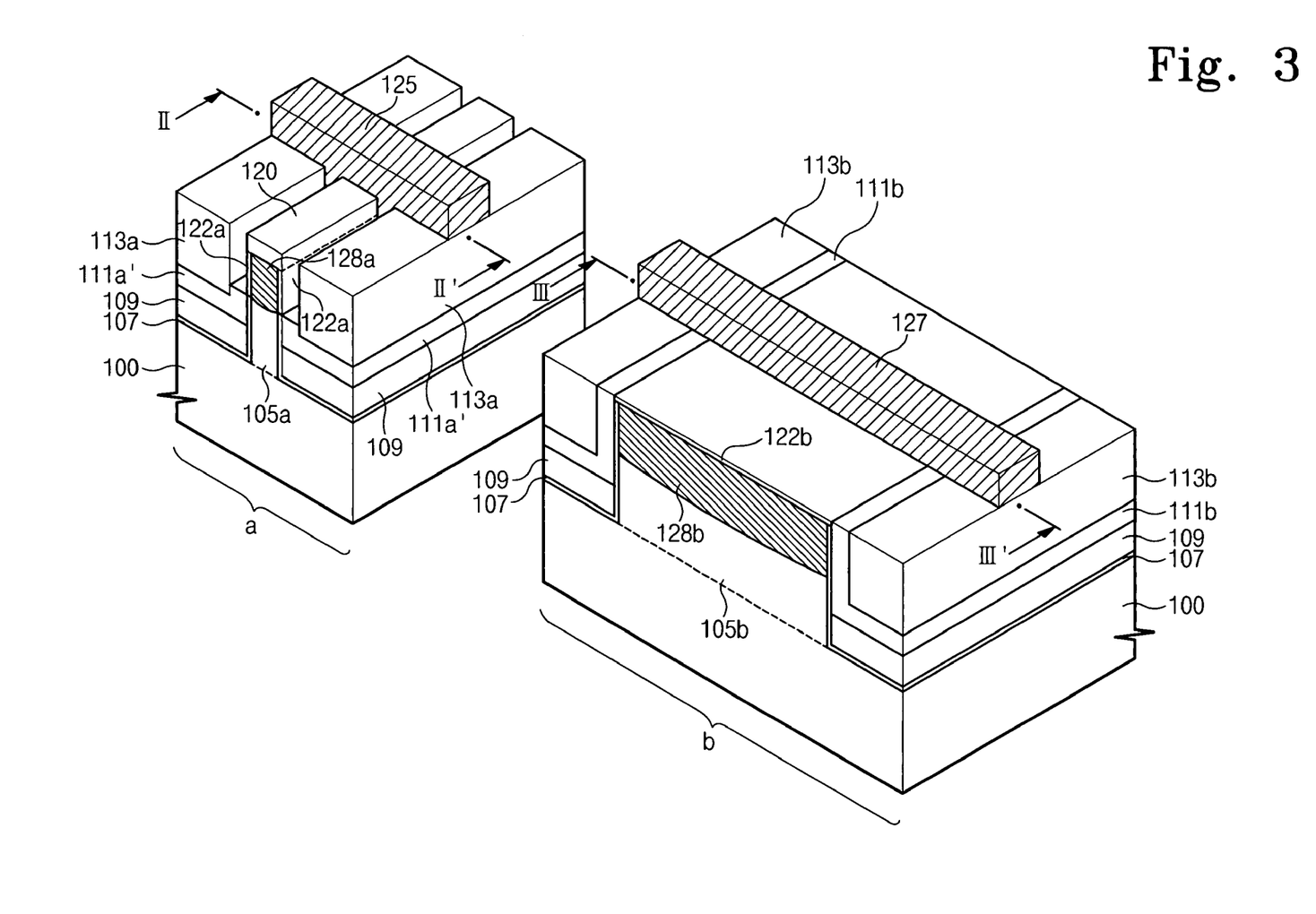
FIG. 3 is a perspective view of a semiconductor device according to various embodiments of the present invention.

FIG. 3 is a perspective view of a semiconductor device according to various embodiments of the present invention.

Referring to FIG. 3, a substrate 100 includes a first region a and a second region b. A fin field effect transistor is formed in the first region a. Cell arrays of semiconductor memory devices may also be formed in the first region a. A flat or planar-type field effect transistor is formed in the second region b. The second region b may be a peripheral circuit region in semiconductor memory devices.

A fin-shaped semiconductor active region 105a is formed in the substrate 100 of the first region a. This fin-shaped active region 105a vertically protrudes from the substrate 100. A planar active region 105b is formed on the substrate 100 of the second region b. The planar active region 105b also vertically protrudes from the substrate 100. The area of the top surface of the planar active region 105b is greater than that of the fin active region 105a.

A first liner 111a' and a first device isolation layer 113a are sequentially stacked along a sidewall of the fin active region 105a. The first liner 111a' is positioned on a lower portion of the sidewall of the fin active region 105a, thereby exposing an upper portion of the sidewall of the fin active region 105a. The top surface of the first liner 111a' is lower than the top surface of the first device isolation layer 113a, such that a groove is defined by the exposed upper sidewall of the fin active region 105a, the top surface of the first liner 111a', and the upper sidewall of the first device isolation layer 113a. A portion of the first liner 111a' also extends along a surface of the substrate 100 neighboring the fin active region 105a and is in contact with a bottom surface of the first device isolation layer 113a. As such, the first liner 111a' is positioned between the first device isolation layer 113a and the substrate 100.

A second liner 111b and a second device isolation layer 113b are sequentially stacked along a sidewall of the planar active region 105b. The second liner 111b may cover a majority of the sidewall of the planar active region 105b. A portion of the second liner 111b also extends along a surface of the substrate 100 neighboring the planar active region 105b and is in contact with a bottom surface of the second device isolation layer 113b. As such, the second liner 111b is positioned between the second device isolation layer 113b and the substrate 100.

The first and second device isolation layers 113a and 113b may be made of silicon oxide. Preferably, the first and second liners 111a' and 111b may be made of an insulation layer having an etch selectivity with respect to the first and second device isolation layer 113a and 113b. For example, the first and second liners 111a' and 111b may be made of silicon nitride.

A buffer oxide layer 107 is positioned between the first liner 111a' and the fin active region 105a, and between the second liner 111b and the planar active region 105b. Portions of the first and second liners 111a' and 111b may be positioned on the buffer oxide layer 107. The buffer oxide layer 107 may be formed of a thermal oxide or a chemical vapor deposition (CVD) oxide.

A supplemental insulation layer 109 may be positioned between the first liner 111a' and the substrate 100, and between the second liner 111b and the substrate 100. The supplemental insulation layer 109 may also be positioned on the buffer oxide layer 107, and may be in contact with portions of buffer oxide layer 107 on the lower sidewall of the fin and planar active regions 105a and 105b. The supplemental insulation layer 109 may be made of a Spin-On-Glass (SOG) layer such as HSQ (Hydrogen Silses Quioxane), or of a polysilazane material.

Still referring to FIG. 3, a capping gate insulation layer 120 is formed on the upper surface of the fin active region 105a. The capping insulation layer 120 may preferably be made of a thermal oxide. A first gate insulation layer 122a is formed on at least the exposed upper sidewall of the fin active region 105a, and a second gate insulation layer 122b is formed on the upper surface of the planar active region 105b. The thickness of the capping insulation layer 120 may be greater than that of the first and second gate insulation layers 122a and 122b. The first and second gate insulation layers 122a and 122b may preferably be formed to a thickness suitable for a fin field effect transistor and a planar field effect transistor, respectively. Also, the first and second gate insulation layers 122a and 122b may preferably be made of the same material. For example, the first and second gate insulation layers 122a and 122b may both be made of a thermal oxide or a CVD oxide.

A first gate electrode 125 is formed on the fin active region 105a, on the capping insulation layer 120, and in the groove defined by the exposed upper sidewall of the fin active region 105a, the top surface of the first liner 111a', and the upper sidewall of the first device isolation layer 113a. In other words, the first gate electrode 125 is formed over the upper surface and both upper sidewalls of the fin active region 105a. As such, the capping insulation layer 120 is positioned between the first gate electrode 125 and the upper surface of the fin active region 105a, and the first gate insulation layer 122a is positioned between the first gate electrode 125 and the upper sidewalls of the fin active region 105a. A second gate electrode 127 is formed on the upper surface of the planar active region 105b. The second gate insulation layer 122b is positioned between the second gate electrode 127 and the upper surface of the planar active region 105b.

The first and second gate electrodes 125 and 127 may be made of doped polysilicon, polycide or other conductive materials. Other such conductive materials may include metals (such as tungsten or molybdenum), conductive metal nitrides (such as titanium nitride, tantalum nitride or tungsten nitride) or metal silicides (such as tungsten silicide or titanium silicide).

First source/drain regions 128a are formed in the fin active region 105a at both sides of the first gate electrode 125, and second source/drain regions 128b are formed in the planar active region 105b at both sides of the second gate electrode 127. The first and second source/drain regions 128a and 128b may be formed by doping the fin and planar active regions 105a and 105b with impurities of the same type. In addition, the first and second source/drain regions 128a and 128b may also be doped with the same impurity concentration. Alternatively, the first and second source/drain regions 128a and 128b may be doped with different impurity types and in different concentrations. Current may flow between respective source and drain regions when the semiconductor device is biased in a forward on-state mode of operation, i.e. when the gate voltage is greater than the threshold voltage.

In the semiconductor device described above, the thickness of the capping gate insulation layer 120 is sufficiently greater than that of the first gate insulation layer 122a, such that an inversion-layer channel is not formed at the upper surface of the fin active region 105a of the fin field effect transistor in the first region a when the transistor is disposed in a forward on-state mode of operation. Alternatively, the thickness of the capping gate insulation layer 120 may be similar to that of the first gate insulation layer 122a. In this case, the capping gate insulation layer 120 may be formed of a material with a higher dielectric strength than that of the first gate insulation layer 122a, such that a greater gate bias may be required to form an inversion-layer channel at the upper surface of the fin active region 105a. In either case, responsive to a sufficient gate bias, inversion-layer channels are formed adjacent only the upper sidewalls of the fin active region 150a. Thus, the channel region of the fin field effect transistor includes only the vertical channels adjacent both upper sidewalls of the fin active region 105a. As a result, the "hump" phenomenon may be reduced, thereby improving the characteristics of the fin field effect transistor.

In addition, the second liner 111b is formed on the entire sidewall of the planar active region 105b, such that a groove may not be formed around the planar active region 105b. Also, the second gate insulation layer 122b is positioned between the second gate electrode 127 and the plate active region 105b. As a result, the field effect transistor in the second region b may have characteristics suitable for a planar field effect transistor.

FIGS. 4 to 10 are cross-sectional views illustrating methods for forming a semiconductor device according to various embodiments of the present invention taken along line II-II' and III-III' of FIG. 3.

Figure 4:
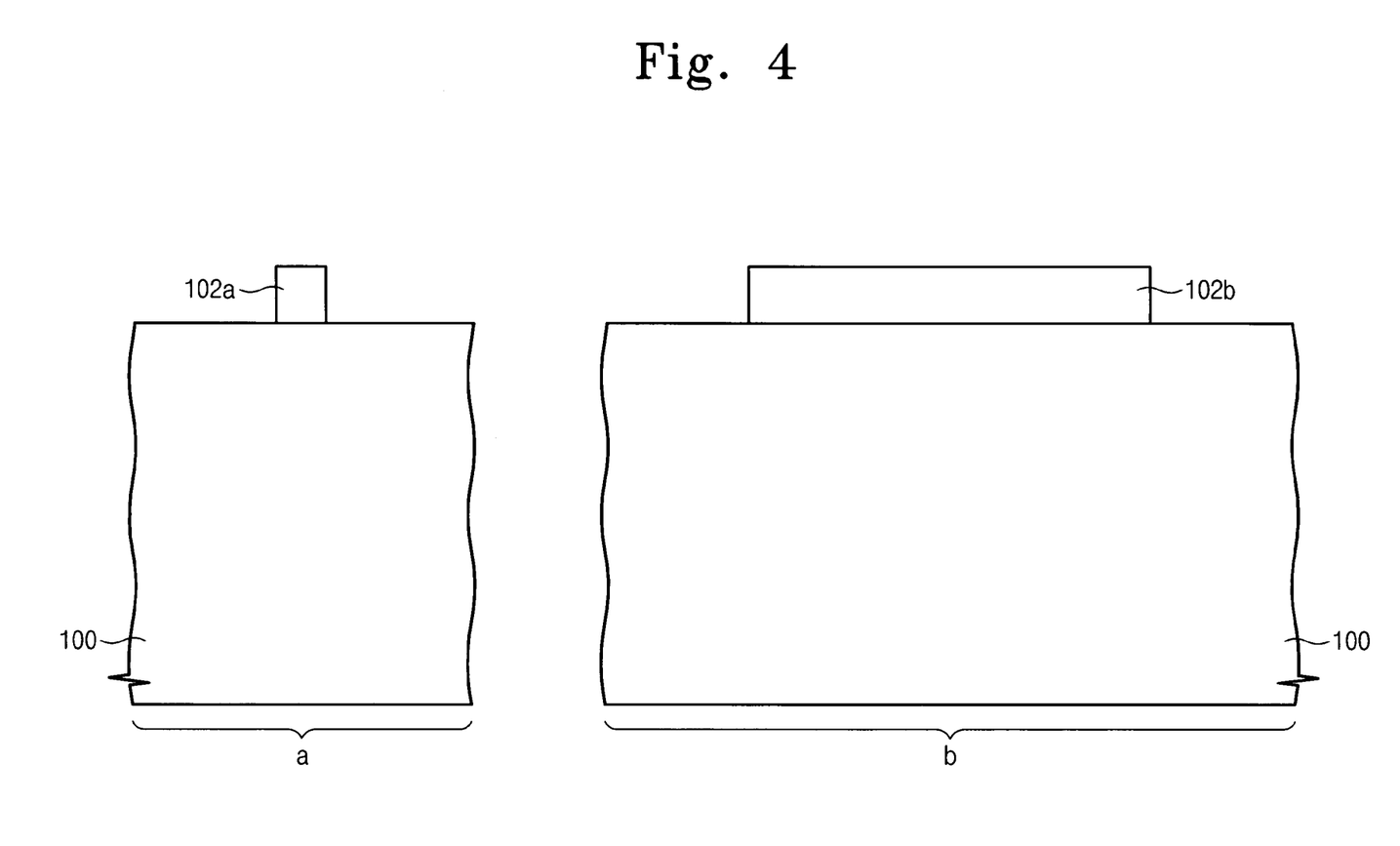
FIGS. 4 to 10 are cross-sectional views illustrating methods of forming a semiconductor device according to various embodiments of the present invention taken along lines II–II' and III–III' of FIG. 3.

Referring to FIG. 4, a substrate 100 includes first and second regions a and b. A mask layer is formed on an entire surface of the substrate 100. The mask layer is patterned to form a first mask pattern 102a on the substrate 100 of the first region a and to form a second mask pattern 102b on the substrate 100 of the second region b. The first and second mask patterns 102a and 102b may be simultaneously formed. The first and second mask patterns 102a and 102b may be formed of photoresist. Alternatively, the first and second mask patterns 102a and 102b may be formed of a hard disk layer, such as silicon nitride.

Figure 5:
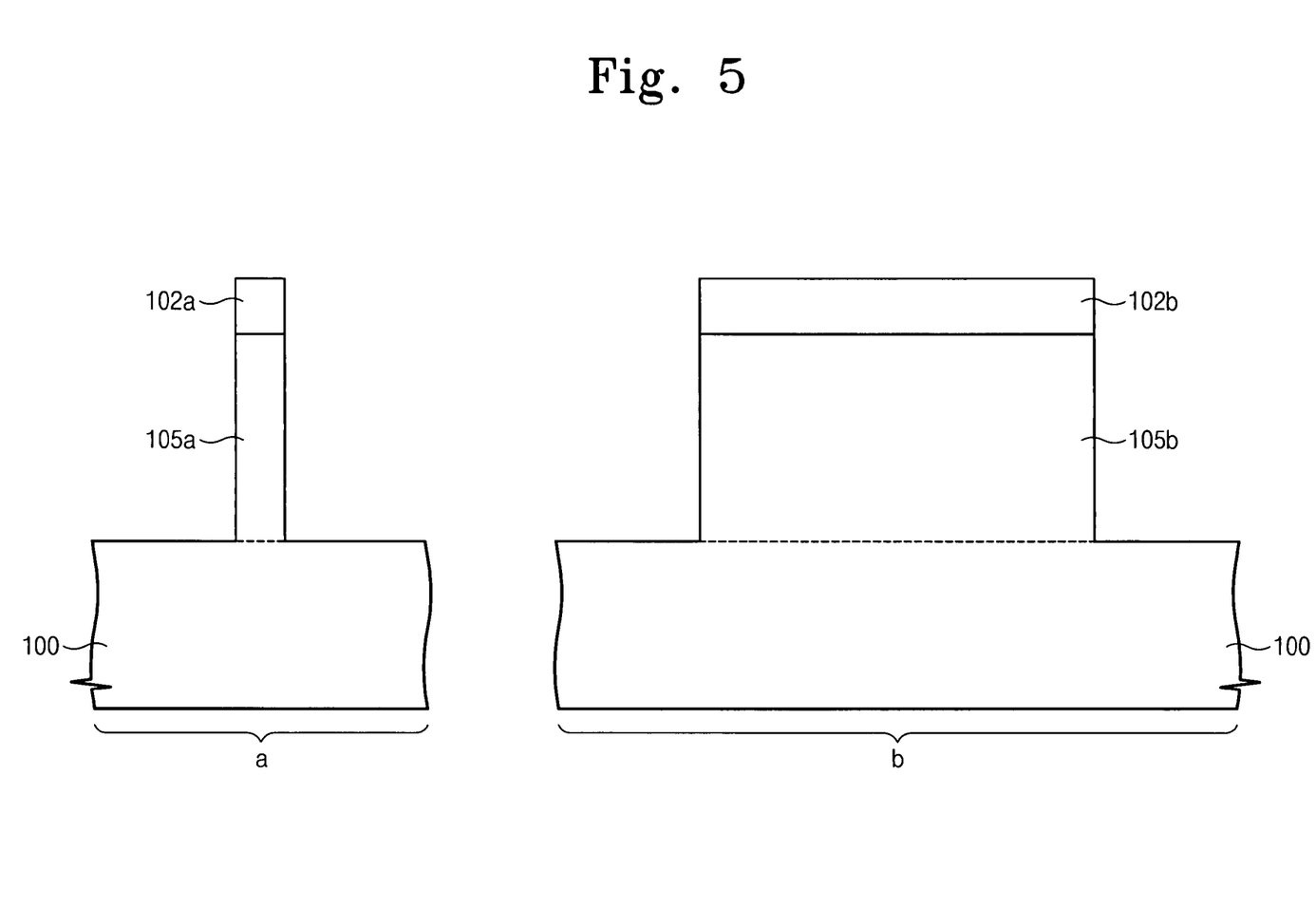

Referring to FIG. 5, the substrate 100 is then etched using the first and second mask patterns 102a and 102b as etch masks to form a fin active region 105a in the first region a and a planar active region 105b in the second region b. The fin and planar active regions 105a and 105b vertically protrude from the substrate 100. The fin active region 105a is fin-shaped. The top surface of the planar active region 105b is wider than that of the fin active region 105a. The etched region of the substrate may be used as a device isolation region.

Figure 6:
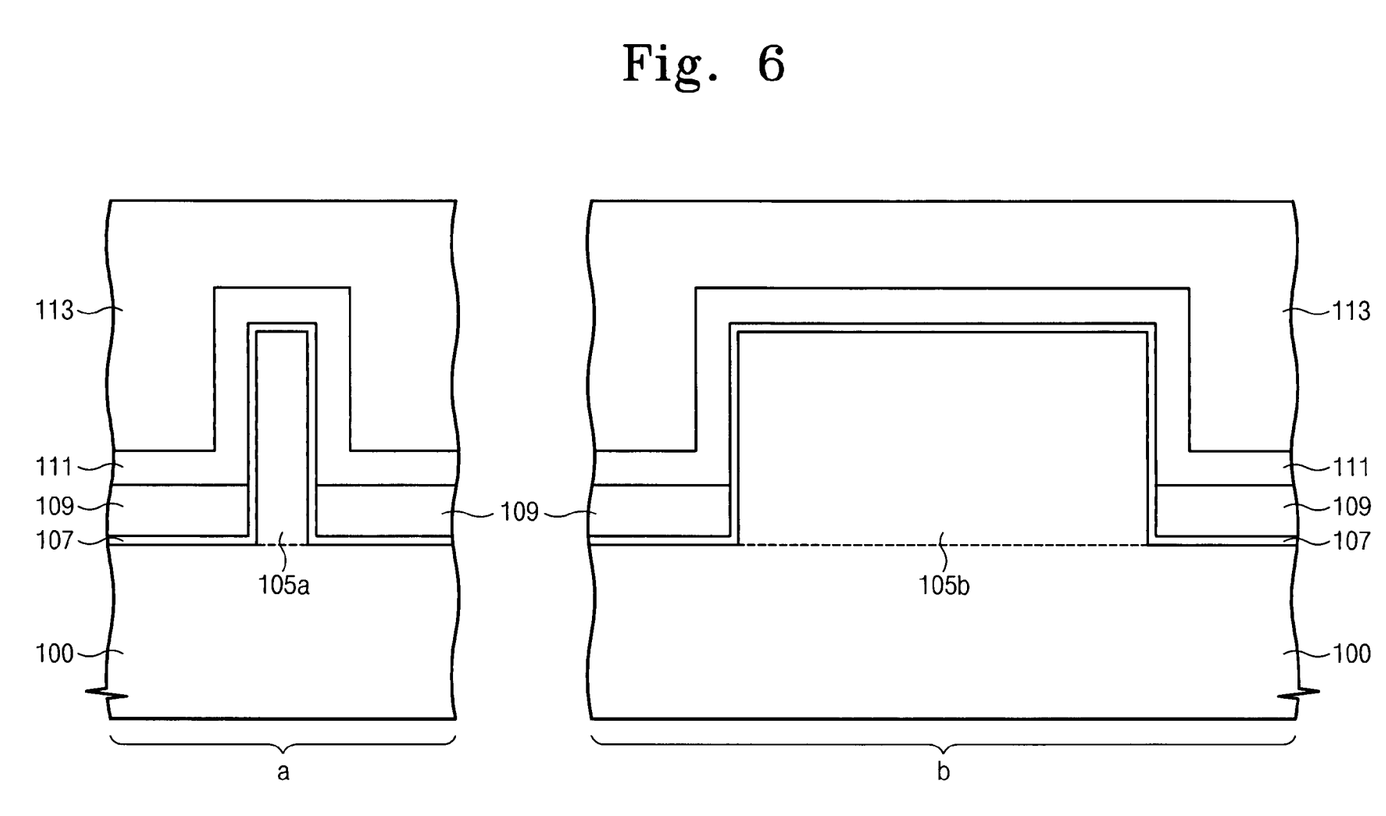

Referring to FIG. 6, the first and second mask patterns 102a and 102b are removed from the fin and planar active regions 105a and 105b on the substrate 100.

A buffer oxide layer 107 is then formed on a majority of the surface of the substrate 100. Lattice defects in the substrate 100 caused by the etching process may be cured during formation of the buffer oxide layer 107. The buffer oxide layer 107 may be formed by thermal oxidation or chemical vapor deposition (CVD). If the buffer oxide layer 107 is formed by CVD, the oxide layer may be deposited early in the deposition process, such that the lattice defects in the substrate 100 may be cured. In order to reduce the aspect ratio of the etched region of the substrate 100, an supplemental insulation layer 109 partially fills the etched region of the substrate 100.

The supplemental insulation layer 109 may be formed of a Spin-On-Glass (SOG) layer having excellent gap-fill characteristics. The SOG layer may be formed as follows. The SOG layer may be applied to a majority of the surface of the substrate 100 by a spin-coating method. As such, the SOG layer may fill a portion of the etched region despite its high aspect ratio. The SOG layer may then be hardened via a bake process to form the supplemental insulation layer 109. After hardening the SOG layer, an upper portion of the hardened SOG layer may be further recessed to a desired height. The SOG layer may be formed of an HSQ (Hydrogen Silses Quioxane) layer or a polysilazane material such as a TOSZ. In some embodiments, the supplemental insulation layer 109 may be omitted.

Still referring to FIG. 6, a liner layer 111 is formed on a majority of the surface of the substrate 100 including the supplemental insulation layer 109. An insulation layer 113 is formed on the liner layer 111, filling the etched region of the substrate 100. The insulation layer 113 may be formed of silicon oxide. The liner layer 111 may preferably be formed of an insulation layer having an etch selectivity with respect to the insulation layer 113. For example, the liner layer 111 may be formed of silicon nitride.

Figure 7:
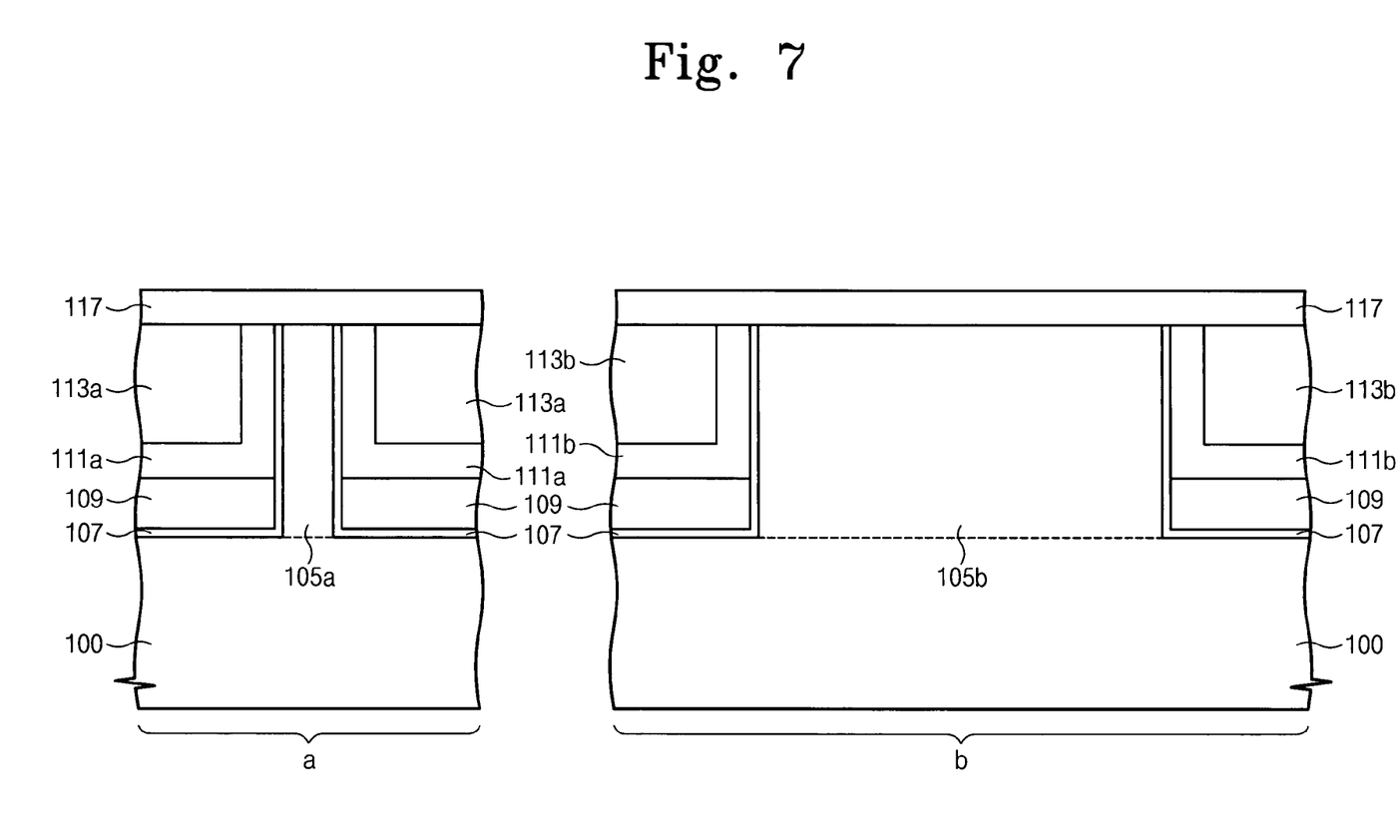

Referring to FIG. 7, the insulation layer 113, the liner layer 111 and the buffer oxide layer 107 are successively planarized until the top surfaces of the fin and planar active regions 105a and 105b are exposed. As a result, a preliminary first liner 111a and a first device isolation layer 113a are formed along sidewalls of the fin active region 105a. A second liner 111b and a second device isolation layer 113b are also formed along sidewalls of the planar active region 105b.

A method for planarizing the insulation layer 113, the liner layer 111 and the buffer oxide layer 107 will now be described. It may be preferable for the insulation layer 113 to be planarized using chemical-mechanical polishing (CMP) until the liner layer 111 is exposed. The insulation layer 113 may also be planarized using isotropic etching. The planarized insulation layer 113 may then be recessed to form the first and second device isolation layers 113a and 113b. The exposed liner layer 111 may be etched-back until the buffer oxide layer 107 is exposed to form the preliminary first liner 11a and the second liner 111b. The exposed buffer oxide layer 107 may then be removed to expose the top surfaces of the fin and planar active regions 105a and 105b.

The liner layer 111 may be etched-back after recessing the planarized insulation layer 113. Alternatively, the planarized insulation layer 113 may be recessed after etching-back the liner layer 111, and the exposed buffer oxide layer 107 may be removed after recessing the planarized insulation layer 113.

To control the threshold voltage of the fin field effect transistor, impurity ions may be implanted into the fin active region 105a using a first sacrificial oxide layer (not shown). Likewise, to control the threshold voltage of the planar field effect transistor, impurity ions may be implanted into the planar active region 105b using a second sacrificial oxide layer (not shown). The first and second sacrificial oxide layers may be removed after implanting the respective impurity ions.

Still referring to FIG. 7, an oxidation barrier layer 117 is formed on a majority of the surface of the substrate 100, including the exposed top surfaces of the fin and planar active regions 105a and 105b. The oxidation barrier layer 117 may prevent lower layers from being oxidized. In addition, it may be preferable for the oxidation barrier layer 117 to be formed of a material having an etch selectivity with respect to the first and second device isolation layers 113a and 113b.

Figure 8:
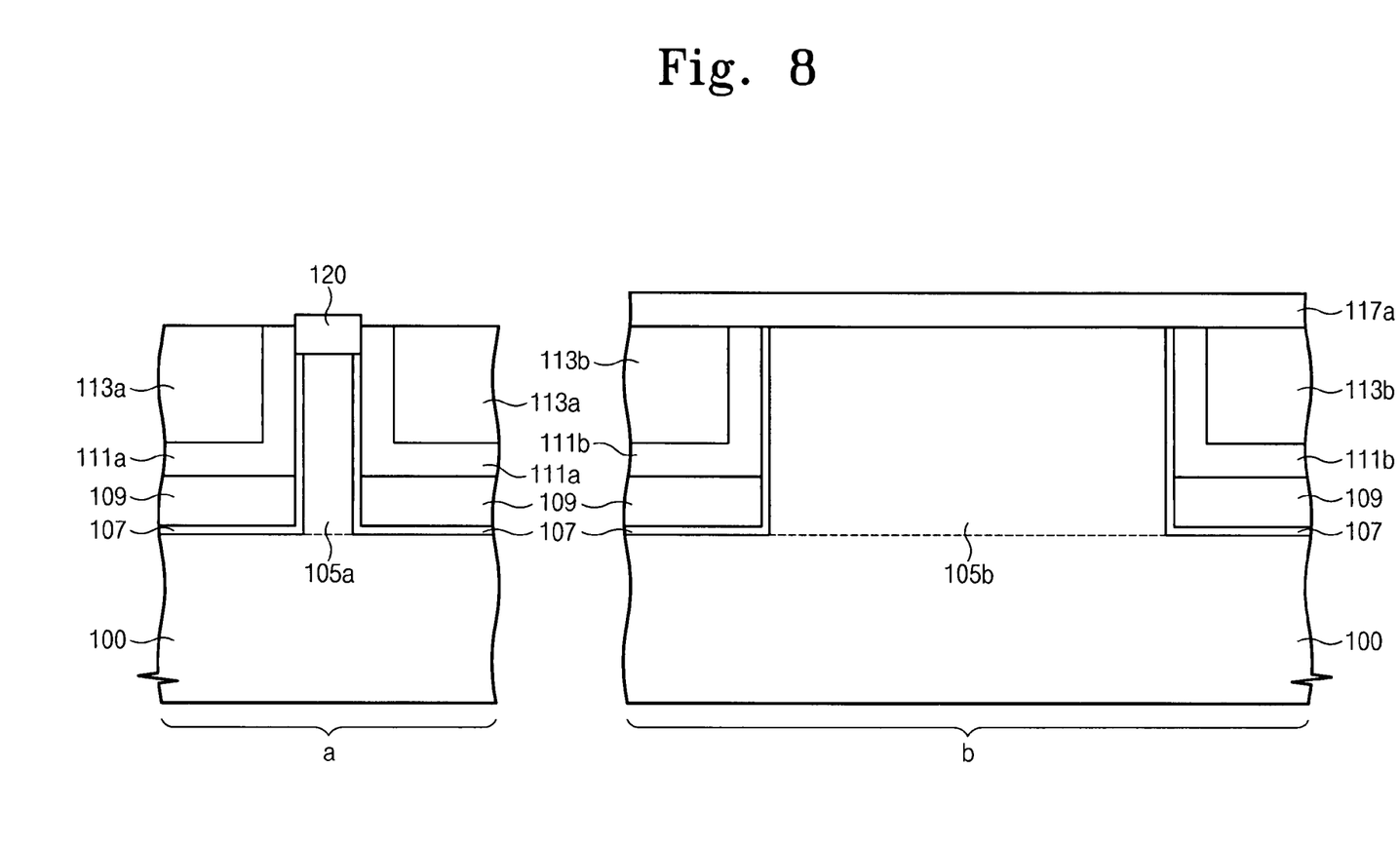

Referring to FIG. 8, the oxidation barrier layer 117 is patterned to expose at least the upper surface of the fin active region 105a. The patterned oxidation barrier layer 117a remains on the upper surface of the planar active region 105b. Also, the patterned oxidation barrier layer 117a may preferably cover the second liner 111b.

A capping insulation layer 120 is then formed on an exposed upper surface of the fin active region 105a using a thermal oxidation process. As a result, the capping insulation layer 120 is selectively formed on the upper surface of the fin active region 105a. The capping insulation layer 120 is formed to a thickness sufficient to preclude the formation of an inversion-layer channel at the upper surface of the fin active region 105a.

The capping insulation layer 120 may be formed after the impurity ions are implanted using the above-mentioned sacrificial layers. As such, the capping layer 120 may not be subjected to etching damage when the sacrificial layers are removed.

Figure 9:
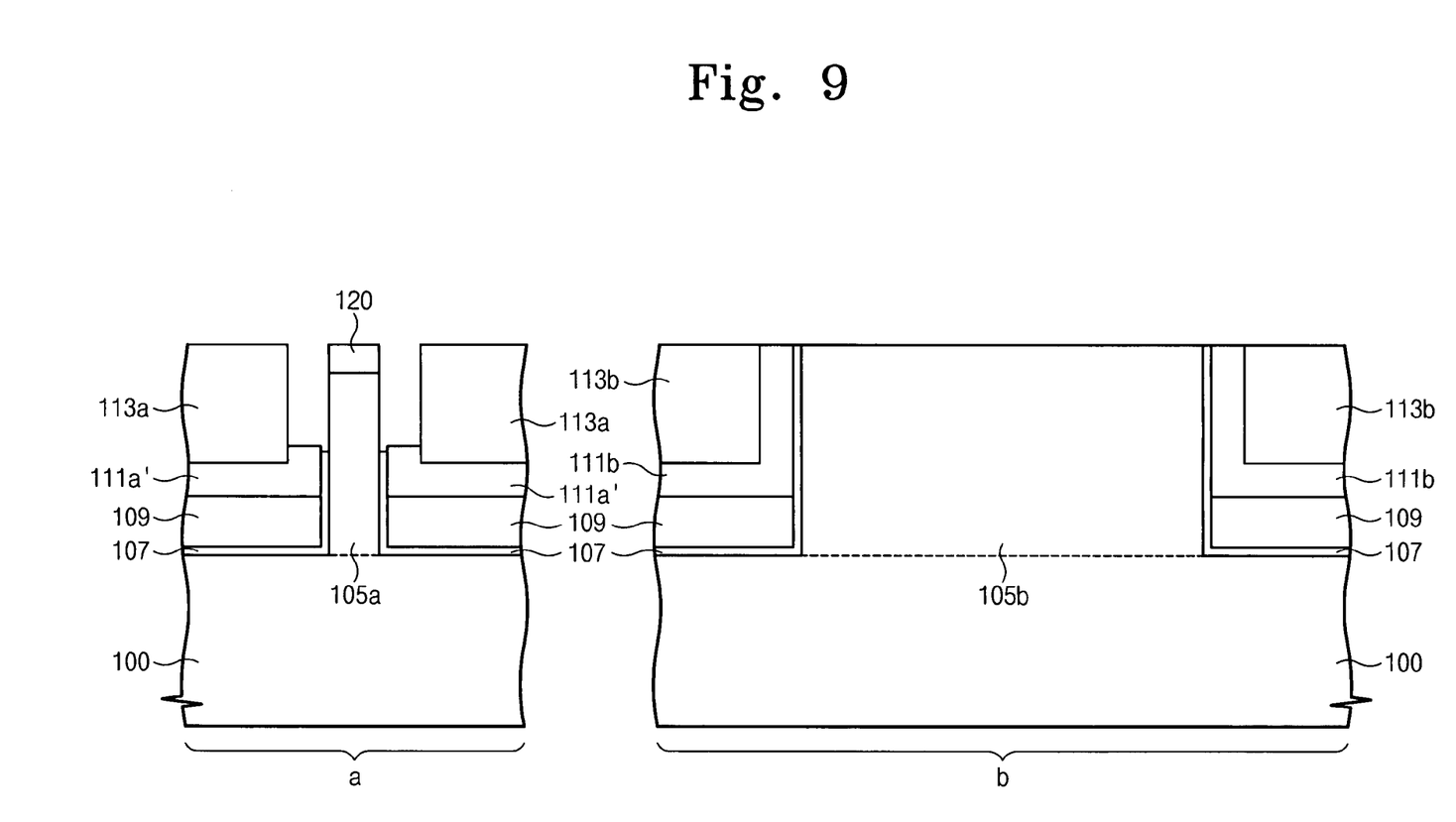

Referring to FIG. 9, the patterned oxidation barrier layer 117a is removed from the substrate 100. The preliminary first liner 111a is selectively recessed to form a first liner 111a' on a lower portion of sidewalls of the fin active region 105a, exposing the buffer oxide layer 107 on the upper sidewalls of the fin active region 105a. The exposed buffer oxide layer 107 is then recessed to expose the upper sidewall of the fin active region 105a.

In some embodiments, the oxidation barrier layer 117 may be formed of a material having the same etching rate as the preliminary first liner 111a. Accordingly, the patterned oxidation barrier layer 117a and the preliminary first liner 111a may be simultaneously removed by adjusting the thickness of the oxidation barrier layer 117. Also, a wet etching process may be used. The oxidation barrier layer 117 may be formed of silicon nitride.

Figure 10:
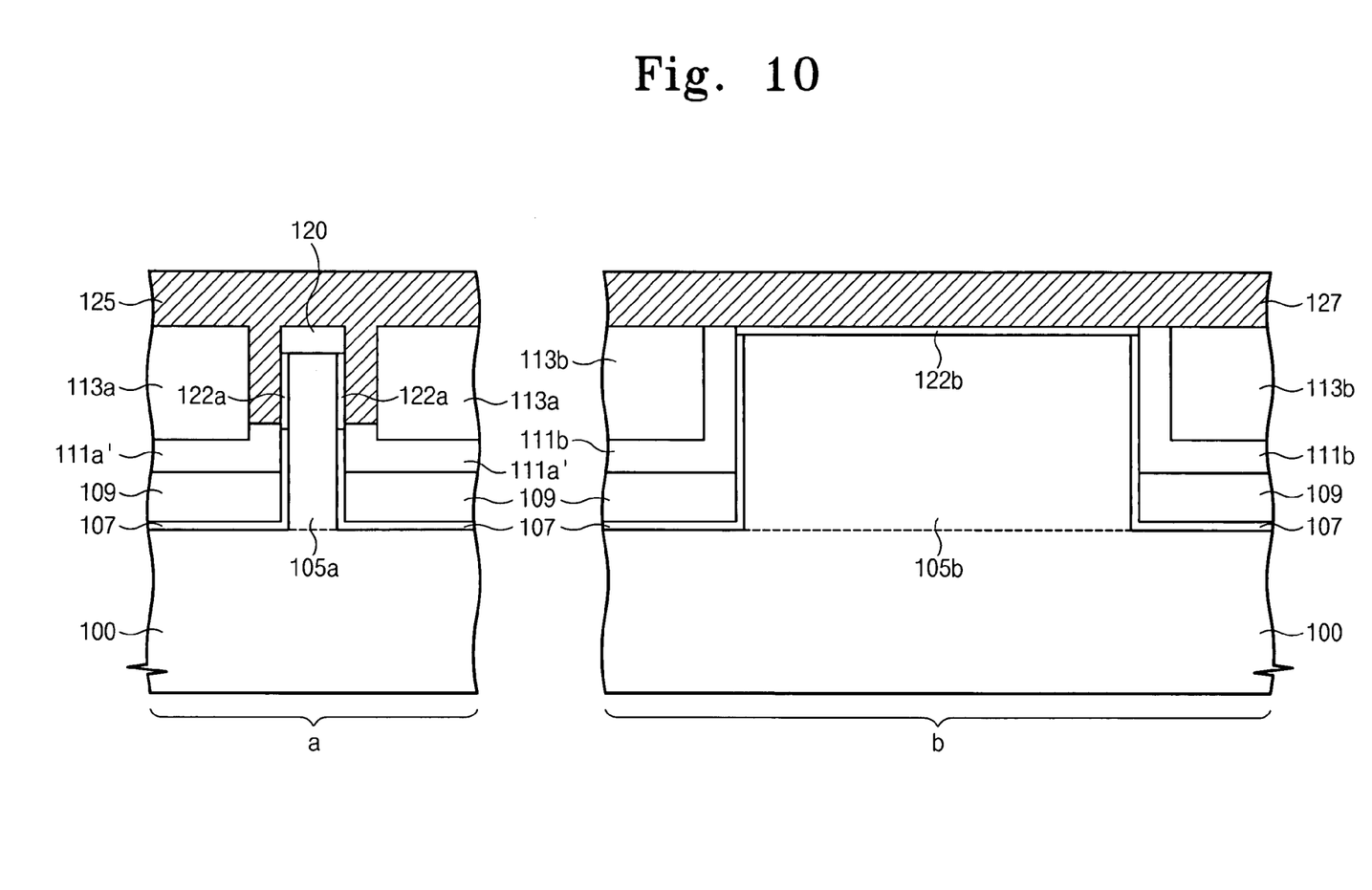

Referring to FIG. 10, first and second gate insulation layers 122a and 122b, first and second gate electrodes 125 and 127, and first and second source/drain regions 128a and 128b are formed. Methods for forming these elements will now be described.

A first gate insulation layer 122a on the exposed upper sidewalls of the fin active region 105a and a second gate insulation layer 122b on the exposed upper surface of the planar active region 105b are formed using a thermal oxidation process. Alternatively, the first and second gate insulation layers 122a and 122b may be formed by CVD. The first and second gate insulation layers 122a and 122b may be formed of the same materials. The first and second gate insulation layers 122a and 122b may also be formed to the same thickness. However, the thickness of the capping layer 120 is greater than that of the first and second gate insulation layers 122a and 122b.

A gate conductive layer is then formed on the surface of the substrate 100 including the first and second gate insulation layers 122a and 122b. The gate conductive layer is patterned to form first and second gate electrodes 125 and 127. The first and second gate electrodes 125 and 127 may be formed of doped polysilicon, polycide, or other conductive material. Other such conductive materials may include metals (such as tungsten or molybdenum), conductive metal nitrides (such as titanium nitride, tantalum nitride or tungsten nitride), or metal silicides (such as tungsten silicide or titanium silicide).

Impurity ions are selectively implanted using the first gate electrode 125 as a mask to form first source/drain regions 128a in the fin active region 105a at both sides of the first gate electrode 125. Impurity ions are also selectively implanted using the second gate electrode 127 as a mask to form second source/drain regions 128b on the plate active region 105b at both sides of the second gate electrode 127. The first and second source/drain regions 128a and 128b may be sequentially formed. Alternatively, the first and second source/drain regions 128a and 128b may be formed simultaneously.

As previously mentioned, a capping gate insulation layer is selectively formed only on the upper surface of the fin active region of a substrate having a fin active region and a planar active region. The capping gate insulation layer may be formed to a greater thickness than a first gate insulation layer formed on upper sidewalls of the fin active region and a second gate insulation layer formed on an upper surface of the planar active region, such that an inversion-layer channel is not formed at the upper surface of the fin active region.

Alternatively, the capping gate insulation layer may be formed of a material with a higher dielectric strength than the first gate insulation layer to preclude formation of an inversion-layer channel at the upper surface of the fin active region. As such, a fin field effect transistor may have vertical channels along both upper sidewalls of the fin active region, but not at the upper surface of the fin active region, when the transistor is disposed in a forward on-state mode of operation. As a result, it may be possible to minimize the "hump" phenomenon in fin field effect transistors. In addition, the second gate insulation layer may be formed to have suitable characteristics for a planar field effect transistor. Thus, characteristics for both the fin field effect transistor and the planar field effect transistor may be improved.

Many alterations and modifications may be made by those having ordinary skill in the art, given the benefit of present disclosure, without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed is:

1. A method of forming a semiconductor device, the method comprising:
    forming a fin active region by selectively etching a region of a substrate;
    forming a conformal liner layer on the substrate;
    forming an insulation layer on the liner layer to fill the etched region of the substrate;
    planarizing the insulation layer and the liner layer until a top surface of the fin active region is exposed to form a preliminary liner and device isolation layer sequentially stacked on a sidewall of the fin active region;
    forming a capping insulation layer on the top surface of the fin active region;
    selectively recessing the preliminary liner to form a liner on a portion of the sidewall of the fin active region for exposing an upper portion of the sidewall of the fin active region;
    forming a gate insulation layer on at least the exposed surface of the fin active region; and
    forming a gate electrode crossing over the fin active region,
    wherein the capping insulation layer is formed to a thickness thicker than a thickness of the gate insulation layer.

2. A method according to claim 1, further comprising the following before forming the conformal liner layer:
    forming a buffer oxide on the whole substrate having the fin active region,
    wherein planarizing the insulation layer and conformal liner layer comprises planarizing the insulation layer, conformal liner layer and buffer oxide until the top surface of the fin active region is exposed, and wherein recessing the preliminary liner comprises recessing the preliminary liner and buffer oxide to expose the upper portion of the sidewall of the fin active region.

3. A method according to claim 1, further comprising forming a supplemental insulation layer on the substrate to fill a portion of the etched region of the substrate before forming the conformal liner layer.

4. A method according to claim 1, wherein forming the insulation layer and liner layer comprises:
  planarizing the insulation layer by chemical mechanical polishing process until the conformal liner layer is exposed;
  forming the device isolation layer by recessing the planarized insulation layer; and
  performing an etch back process at the exposed conformal liner layer until the top surface of the fin active region is exposed to form the preliminary liner.

5. A method according to claim 1, wherein the capping insulation layer is formed by performing a thermal oxidation process at the exposed top surface of the fin active region.

6. A method according to claim 1, after forming the gate electrode, further comprising:
  implanting impurity ions using the gate electrode as a mask to form source/drain regions at the fin active region on both sides of the gate electrode.

7. A method of forming a semiconductor device, the method comprising:
  selectively etching a substrate having first and second regions to form a fin active region in the first region and a planar active region in the second region;
  forming a conformal liner layer on the substrate;
  forming a insulation layer on the conformal liner layer to fill the etched region of the substrate;
  planarizing the insulation layer and conformal liner layer until top surfaces of the fin and planar active regions are exposed to form a preliminary first liner and a first device isolation layer sequentially stacked on a sidewall of the fin active region and a second liner and second device isolation layer sequentially stacked on a sidewall of the planar active region;
  forming a capping insulation layer on a top surface of the fin active region;
  selectively recessing the preliminary first liner to form a first liner on a portion of the sidewall of the fin active region for exposing a upper portion of the sidewall of the fin active region;
  forming a first gate insulation layer on at least the exposed surface of the fin active region and a second gate insulation layer on a top surface of the planar active region; and
  forming a first gate electrode crossing over the capping insulation layer and fin active region and a second gate electrode crossing over the planar active region,
  wherein the capping insulation layer is formed to a thickness thicker than a thickness of the first and second gate insulation layers.

8. A method according to claim 7, before forming the conformal liner layer, further comprising:
  forming a buffer oxide on the substrate having the fin and planar active regions,
  wherein planarizing the insulation layer and conformal liner layer comprises planarizing the insulation layer, conformal liner layer and buffer oxide until the top surfaces of the fin and planar active regions, and
  wherein recessing the preliminary first liner comprises successively recessing the preliminary first liner and the buffer oxide until the upper portion of the sidewall of the fin active region.

9. A method according to claim 7, further comprising:
  forming a supplemental insulation layer on the substrate to fill a portion of the etched region of the substrate before forming the conformal liner layer.

10. A method according to claim 7, wherein planarizing the insulation layer and the conformal liner layer comprises:
  planarizing the insulation layer by chemical mechanical polishing process until the conformal liner layer is exposed;
  recessing the planarized insulation layer to form the first and second device isolation layers; and
  performing an etch back process on the exposed conformal liner layer until the top surfaces of the fin and planar active regions are exposed to form the first and second liners.

11. A method according to claim 7, wherein forming the capping insulation layer comprises:
  forming an oxidation barrier layer on the substrate;
  patterning the oxidation barrier layer to expose the top surface of the fin active region;
  performing thermal oxidation process on the exposed top surface of the fin active region to form the capping insulation layer; and
  removing the patterned oxidation barrier layer.

12. A method according to claim 11, wherein removing the patterned oxidation barrier layer and recessing the preliminary first liner are performed simultaneously.

13. A method according to claim 7, further comprising the following after forming the first and second gate electrode:
  implanting impurity ions using the first gate electrode as mask to form first source/drain regions in the fin active region on both sides of the first gate electrode; and
  implanting impurity ions using the second gate electrode as mask to form second source/drain regions in the planar active region on both sides of the second gate electrode.

14. A method according to claim 13, wherein the first and second source/drain regions are formed simultaneously.

15. A method of forming a vertical channel field effect transistor on a fin-shaped active region of a semiconductor substrate, the method comprising:
  forming an insulated gate electrode on an upper surface and opposing sidewalls of the fin-shaped active region, wherein forming the insulated gate electrode comprises forming a capping gate insulation layer on the upper surface of the fin-shaped active region to a thickness sufficient to preclude formation of an inversion-layer channel along the upper surface when the transistor is disposed in a forward on-state mode of operation; and
  forming a sidewall gate insulation layer on sidewalls of the fin-shaped active region having a thickness similar to the thickness of the capping gate insulation layer,
  wherein forming the capping gate insulation layer further comprises forming the capping gate insulation layer of a material having a higher dielectric strength than the sidewall gate insulation layer.

16. A method of forming a vertical channel field effect transistor on a fin-shaped active region of a semiconductor substrate, the method comprising:
  forming a buffer oxide layer on the fin-shaped active region of the substrate;
  forming a liner layer on the buffer oxide layer;
  forming an insulation layer on the liner layer;
  planarizing the insulation layer, the liner layer, and the buffer oxide layer to expose an upper surface of the fin-shaped active region;
  forming a capping gate insulation layer on the upper surface of the fin-shaped active region to a thickness sufficient to preclude formation of an inversion-layer channel along the upper surface when the transistor is disposed in a forward on-state mode of operation;

recessing the liner layer to expose a portion the buffer oxide layer on upper sidewalls of the fin-shaped active region;

removing the exposed portion of the buffer oxide layer to expose the upper sidewalls of the fin-shaped active region;

forming a sidewall gate insulation layer on the exposed upper sidewalls of the fin-shaped active region; and forming a gate electrode on the upper surface and opposing sidewalls of the fin-shaped active region, wherein forming the capping gate insulation layer further comprises forming the capping gate insulation layer to a thickness greater than a thickness of the sidewall gate insulation layer.

17. The method of claim 16, wherein forming the capping gate insulation layer comprises thermally oxidizing the upper surface of the fin-shaped active region.

18. The method of claim 16, further comprising:
forming a supplemental insulation layer on the buffer oxide layer prior to forming the conformal liner layer.

19. Method of claim 16, wherein the substrate includes a planar active region adjacent the fin-shaped active region and the method further comprises the following after planarizing:

forming an oxidation barrier layer on the fin active region and the planar active region; and patterning the oxidation barrier layer to expose the top surface of the fin active region, wherein recessing the liner layer comprises simultaneously recessing the conformal liner layer on the fin-shaped active region and the oxidation barrier layer on the planar active region.

20. A method of forming semiconductor devices on a semiconductor substrate, comprising:

selectively etching the substrate to form a fin-shaped active region and a planar active region;

forming a buffer oxide layer on the fin-shaped active region and the planar active region;

forming a liner layer on the buffer oxide layer;

forming a insulation layer on the liner layer;

planarizing the insulation layer, the liner layer, and the buffer oxide layer to expose upper surfaces of the fin-shaped active region and the planar active region;

forming an oxidation barrier layer on the fin active region and the planar active region;

patterning the oxidation barrier layer to expose the upper surface of the fin active region; and forming an insulated gate electrode on the upper surface and opposing sidewalls of the fin-shaped active region, wherein forming the insulated gate electrode comprises:

forming a capping gate insulation layer on the upper surface of the fin-shaped active region to a thickness sufficient to preclude formation of an inversion-layer channel along the upper surface when the transistor is disposed in a forward on-state mode of operation;

recessing the liner layer on the fin-shaped active region to expose a portion of the buffer oxide layer on upper sidewalls of the fin-shaped active region;

removing the exposed portion of the buffer oxide layer to expose the upper sidewalls of the fin-shaped active region;

forming a sidewall gate insulation layer on the exposed upper sidewalls of the fin-shaped active region; and forming a gate electrode on the upper surface and upper sidewalls of the fin-shaped active region;

wherein a thickness of the capping gate insulation layer is greater than a thickness of the sidewall gate insulation layer.

* * * * *